United States Patent [19]

Matsui et al.

[11] Patent Number: 5,276,647
[45] Date of Patent: Jan. 4, 1994

[54] STATIC RANDOM ACCESS MEMORY INCLUDING STRESS TEST CIRCUITRY

[75] Inventors: Masataka Matsui, Yokohama; Tohru Furuyama, Tokyo; Shigeyuki Hayakawa; Kiyofumi Ochii, both of Yokohama, all of Japan

[73] Assignee: Kabushiki Kaisha Toshiba, Kawasaki, Japan

[21] Appl. No.: 813,438

[22] Filed: Dec. 26, 1991

[30] Foreign Application Priority Data

Dec. 27, 1990 [JP] Japan .................................. 2-418776

[51] Int. Cl.$^5$ ............................................. G11C 7/00
[52] U.S. Cl. ................................ 365/201; 365/189.11; 371/21.1
[58] Field of Search ........................... 365/201, 189.11; 371/21.1

[56] References Cited

U.S. PATENT DOCUMENTS

| | | | |
|---|---|---|---|
| 4,543,647 | 9/1985 | Yoshida | 365/201 |
| 4,802,137 | 1/1989 | Okuda et al. | 365/201 |
| 4,958,326 | 9/1990 | Sakurai | 365/218 |
| 4,999,813 | 3/1991 | Ohtsuka et al. | 365/189.11 |
| 5,132,929 | 7/1992 | Ochii | 365/201 |
| 5,177,745 | 1/1993 | Rozman | 365/201 |

Primary Examiner—Eugene R. LaRoche
Assistant Examiner—Christopher R. Glembocki
Attorney, Agent, or Firm—Banner, Birch, McKie & Beckett

[57] ABSTRACT

SRAM comprises a word line driving circuit selecting a predetermined number of word lines in accordance with an input address at the time of a normal operation, and simultaneously selecting all word lines or word lines, which are more than the number of word lines to be selected at the time of the normal operation, at the time of a voltage stress applying test, and a bit line load circuit applying a predetermined bias voltage to said pair of bit lines at the time of the normal operation, and controlling the bias voltage not to be applied to at least one of said pair of bit lines or applying the bias voltage, which is lower than the bias voltage at the time of the normal operation, at the time of the voltage stress test.

14 Claims, 4 Drawing Sheets

STATIC RANDOM ACCESS MEMORY INCLUDING STRESS TEST CIRCUITRY

BACKGROUND OF THE INVENTION

1. Field of the Invention

The present invention relates to a static random access memory (SRAM) and more particularly to a MOS type SRAM having a voltage stress test circuit for performing a screening test of an initial defective mode due to a voltage acceleration.

2. Description of the Related Art

In general, when the semiconductor devices are manufactured and shipped, a screening test for exposing potential defectiveness of the device and removing the defective device in order to prevent the good devices from being deteriorated and ensure high reliability of the devices. As a screening method, there is often used a burn-in method, which can realize an electrical field acceleration and a temperature acceleration at the same time. In the burn-in method, the device is operated in a state that a voltage is set to be higher than the voltage, which is actually used, and temperature is set to be higher than the temperature, which is actually used. As a result, stress, which is higher than stress for a period of time of an initial trouble in a condition of the actual use, can be applied on the device in a short period of time. Thereby, a certain device having a possibility in which the initial operation trouble will occur is selected before shipping and screened. As a result, the device having a possibility in which the initial operation trouble will occur can be effectively removed and reliability of the device can be improved.

The initial trouble of the semiconductor memory occurs mainly in memory cells. This is because the memory cells occupy substantially all the number of elements on the memory. Moreover, since working in the memory cells is the finest and the memory cells are sensitive to the defective.

Particularly, in order to screen deterioration of a gate oxidation film of a MOS FET having a relatively high frequency of generating troubles in the memory cell, it is required that high voltage stress be applied between both ends of the gate oxidation film. Moreover, in order to screen defective leak current of an impurity diffusion region in the memory cell, it is required that high voltage stress is applied between a reverse-biased pn junction between the diffusion region and a semiconductor substrate.

Figure 1:
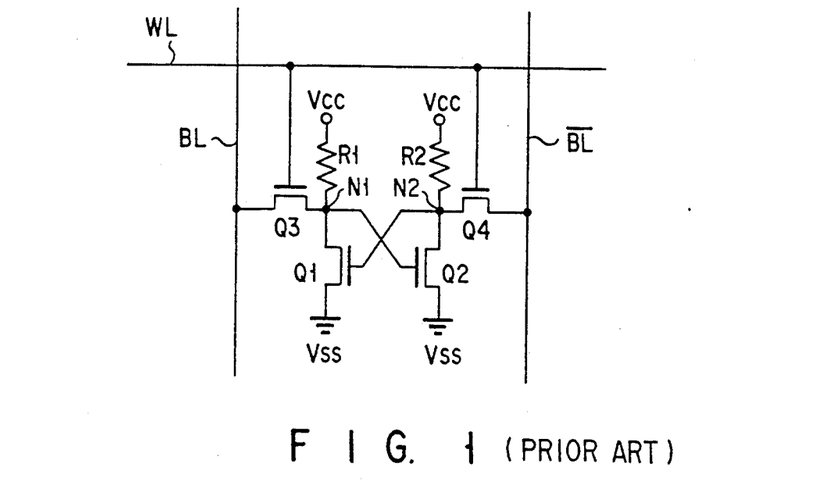
FIG. 1 is a circuit diagram showing one example of a memory cell in a conventional SRAM.

The following explains the case in which the above-mentioned burn-in process is applied to a SRAM using SRAM cells shown in FIG. 1.

In FIG. 1, NMOS transistors Q1, Q2 and resistors R1, R2 constitute a flip-flop circuit. Q3 and Q4 are NMOS transistors for a transfer gate, and each end of the respective transistors Q3 and Q4 is connected to a pair of bit lines BL, /BL, and each gate thereof is connected to a word line WL.

Voltage stress is applied to the transfer gates Q3 and Q4 of the memory cell during only the time when the word line WL is selected. Moreover, inner nodes N1 and N2 for retaining storage data of the memory cell are connected to a power voltage VCC via high resistors R1 and R2. Due to this, voltage stress is applied to the diffusion region, which constitutes the inner nodes N1 and N2, and the gate oxide film of each of the driving transistors Q1 and Q2 for the period of time of ½ the whole test (that is, for the period of time when data "1" or "0" is supplied).

However, in recent years, the SRAM cells are designed such that the values of high resistors R1 and R2 are set to about 1TO in order to reduce stand-by power consumption to several μA. Due to this, even if a little leak current starts to flow at the time when voltage stress is applied to the inner nodes N1 and N2 via high resistors R1 and R2, the voltages of the inner nodes N1 and N2 decrease and sufficient stress may not be applied to these nodes.

From the above-mentioned points, it can be considered that the voltage stress actually is applied to the inner nodes N1 and N2 during only the time when the word line WL is selected.

Regarding the burn-in of SRAM, there is conventionally used a method in which the word lines are scanned in order of address and assessed sequentially. Due to this, voltage stress is applied to the SRAM cell with the frequency, which is much smaller than that of the transistors of the peripheral circuits. This will be explained by use of 1M bit SRAM in which 64 cells are connected to one word line as follows.

For example, while the burn-in process is performed for 100 hours, actual time for applying stress to one cell is only about 6 seconds (as shown in the following calculation below) if stress is applied during only the time when the word line WL is selected.

$$100 \times 60 \times 60 \times (2^5/2^{20}) \times (\tfrac{1}{2}) = 6$$

The above time is stress applying time to the transfer gates Q3 and Q4. Stress applying time to the driving transistors Q1 and Q2 is haft of time is stress applying time to the transfer gates Q3 and Q4. Actually, the word line is selected during only the partial time of one memory cycle.

As mentioned above, stress applying time per one memory cell is $1/10^{10}$ of the testing time. If voltage stress, which is necessary for screening the initial trouble, is to be applied, burn-in time is considerably prolonged non-efficiently, and manufacturing cost of the memory is increased.

In order to solve the above-mentioned problems and extremely improve the efficiency of screening the defective device, one of inventors, who are inventors of the present invention, proposed a semiconductor memory in published Unexamined Japanese Patent Application (Kokai) No. 3-35491 T.FURUYAMA, which corresponds to U.S. application Ser. No. 07/544,614. In this semiconductor memory, voltage stress is simultaneously applied to all word lines or the word lines, which is more than the number of word lines selected at the time of a normal operation of the memory.

In the SRAM, cell arrays are divided into a plurality of blocks and cell current flows to a pair of bit lines of only the block to which the selected cell belongs at the time of the normal operation. However, if all word lines are selected in a state that an operation power is supplied to the memory at the time of screening the defectiveness, a cell current flows to all pairs of bit lines. Due to this, the total bit line current at the time of screening the defectiveness becomes several tens times at the normal operation, so that there is a possibility that the operation fault of SRAM will occur.

Moreover, voltage stress is preferably applied to not only the transfer gates but also the driving transistors in applying voltage stress to the memory cell of SRAM.

SUMMARY OF THE INVENTION

The present invention has been made to consider the above-mentioned problems. An object of the present invention is to provide a SRAM wherein, in a voltage stress applying test to the SRAM cell, if voltage stress is simultaneously applied to all word lines or a number of word lines, which is greater than the number of word lines to selected at the time of the normal operation, the total bit line current is controlled not to be increased to the bit line current at the time of normal operation, thereby making it possible to prevent the operation fault of SRAM from occurring, voltage stress can be applied to all MOS transistors of SRAM cells and data storage maintenance nodes, and efficiency of screening the defective SRAM cells can be considerably improved.

In order to attain the above object, the SRAM of the present invention comprises a word line driving circuit selecting only a predetermined number of word lines of a memory cell array for one memory cycle in accordance with an input address at the time of a normal operation, and simultaneously selecting all word lines or a number of word lines of which is greater than the number of word lines selected at the time of the normal operation for a voltage stress applying test, and a bit line load circuit having two MOS transistors each connected to a pair of bit lines of each column of said memory cell array, applying a predetermined bias voltage to said pair of bit lines at the time of the normal operation and controlling the bias voltage to not be applied to at least one of said paired bit lines or controlling the bias voltage, to be lower than the bias voltage at the normal operation, and to be applied to said paired bit lines at the time of the voltage stress applying test.

According to the SRAM of the present invention, the predetermined number of word lines is driven to be selected in one memory cycle in accordance with the input address and the predetermined bias voltage is applied to the paired bit lines at the time of the voltage stress applying test. Due to this, it is possible to perform a reading/writing from/to the selected SRAM cell.

In a state that the operation power is supplied and the bias voltage is not applied to one of the paired bit lines or the bias voltage, which is lower than the bias voltage at the normal operation, is applied to said paired bit lines, all word lines or a number of word lines, which is greater than the number of word lines selected at the time of the normal operation, are simultaneously driven to be selected at the time of the voltage stress applying test in screening the defectiveness. Thereby, voltage stress can be applied to all MOS transistors of SRAM cells and data storage maintenance nodes, and efficiency of screening the defective SRAM cells can be considerably improved.

Moreover, in a case where a bias voltage, which is lower than the bias voltage at the time of the normal operation, is applied to the paired bit lines or no bias voltage is applied to the paired bit lines at the time of the voltage stress applying test to the SRAM cell, the total bit line current is controlled to not be increased to the bit line current at the time of normal operation. Thereby, the operation fault of SRAM can be prevented from occurring.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the semiconductor device of the present invention will be explained with reference to the drawings. In this explanation, the common reference numerals are added to the common portions to all drawings.

Figure 2:
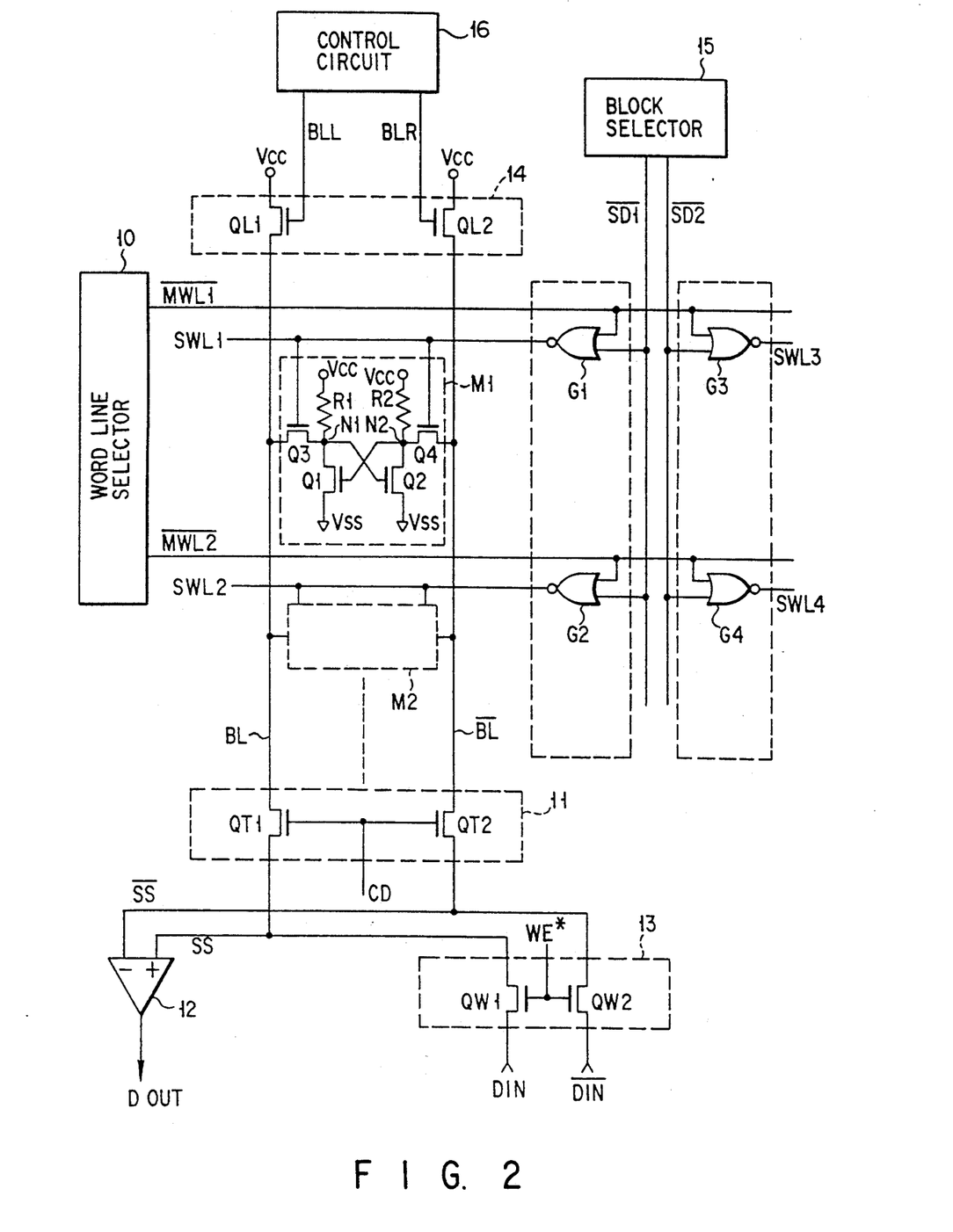
FIG. 2 is a circuit diagram showing a part of a SRAM relating to a first embodiment of the present invention.

FIG. 2 is a circuit diagram showing a part of a SRAM relating to a first embodiment of the present invention.

A memory cell array of the SRAM has a plurality of SRAM cells M1, M2, which are arranged in a matrix manner, a plurality of word lines /MWL1, /MWL2, for selecting the memory cells, and a plurality of pairs of bit lines (for example, only one pair of bit lines BL, /BL is shown) receiving and transmitting data between the memory cells.

In this embodiment, there is used a memory array of a double word line system which is divided into a plurality of blocks in a row direction. This system has main word lines which are formed in common to the plurality of blocks, and sub-word lines, which are formed every block. The plurality of blocks (for example, two blocks are shown) are selected by block selection signals (section decode signals) /SD1 and /SD2 to be supplied from a block selector 15. A sub-word line selection gate G1 ANDs a signal of a first main word line /MWL1 and a first block selection signal /SD1, and supplies an output to a sub-word line SWL1. A sub-word line selection gate G2 ANDs a signal of a second main word line /MWL2 and the first block selection signal /SD1, and supplies an output to a sub-word line SWL2. A sub-word line selection gate G3 ANDs a signal of a first main word line /MWL1 and a second block selection signal /SD2, and supplies an output to a sub-word line SWL3. A sub-word line selection gate G4 ANDs a signal of the second main word line /MWL2 and a second block selection signal /SD2, and supplies an output to a sub-word line SWL4.

The SRAM cells M1 and M2 are selected by the sub-word lines SWL1, SWL2, and transfer storage data between the pair of bit lines BL, /BL. In this embodiment, an NMOS memory cell of a high resistor load type is used.

Each of SRAM cells M1, M2 comprises a flip-flop, which is formed of two load high resistance resistors R1 and R2 and two driving NMOS transistors Q1 and Q2 connected to each other in a cross manner, and two NMOS transistors Q3 and Q4 for a transfer gate. The transistors Q3 and Q4 are connected between complementary two storage data maintaining nodes N1 and N2 of the flip-flop and the paired bit lines BL, /BL. The sub-word lines SWL1, SWL2, are connected to the gate of the transistors Q3 and Q4.

Reference numeral 10 is a word line selector, which is connected to the main word lines /MWL1 and /MWL2. The word line selector 10 is controlled to select a predetermined number of main word lines in one cycle in accordance with an input address at the time of the normal operation, and simultaneously select all main word lines or a number of main word lines, which is greater than the number of main word lines selected at the time of the normal operation, at a voltage stress applying test.

Reference numeral 11 is a column selection circuit, which is connected to the pair of bit lines BL and /BL of each column, and controlled by a column selection signal CD from a column decoder (not shown). In the column selection circuit 11, the column selection signal CD is supplied to the gate of the pair of NMOS transistors QT1 and QT2, which are connected between the paired bit line BL, /BL and a pair of common bit lines SS, /SS. The pair of common bit lines SS, /SS are connected to the plurality of column selection circuits 11 in common.

Reference numeral 12 is a differential sense amplifier, which is connected to the column selection circuit 11 via the pair of common bit lines SS, /SS. Dout denotes a read out data output.

Reference numeral 13 is a writing circuit, which is connected to the column selection circuit 11 via the pair of common bit lines SS, /SS. The writing circuit 13 outputs writing data to the common bit lines SS, /SS in accordance with complementary writing data input (DIN, /DIN). WE denotes an internal writing signal, which is generated based on a writing enable signal from the outer unit.

Reference numeral 14 is a bit line load circuit, which is connected to the pair of bit lines of each column. The bit line load circuit 14 is controlled to apply a predetermined bias voltage to the pair of bit lines at the time of the normal operation and to not apply the bias voltage to at least one of the paired bit lines at the time of the voltage stress applying test. The bit line load circuit 14 comprise NMOS transistors QL1 and QL2 whose drain and source are connected between the VCC node and the pair of bit lines BL, /BL. In the transistors QL1 and QL2, different control signals BLL and BLR are supplied to each gate from a control circuit 16, and the switching control of a low impedance state or a high impedance state (or off state) is performed.

An operation of SRAM of FIG. 2 will be explained as follows.

At the time of a normal reading/writing operation, a main word line selection signal (for example, /MWL1) to which a memory cell corresponding to an address signal belongs and a block selection signal (for example, /SD1) for selecting a block to which the memory cell corresponding to the address signal belongs are controlled to be selected.

The sub-word line selection gate G1 ANDs these signals. As a result, there is selected only one sub-word line (for example, SWL1) connected to the memory cell of the block to which the memory cell corresponding to the address signal belongs. The bit line load transistors QL1 and QL2 are respectively controlled to be in a low impedance state by each of the control signals BLL and BLR. Due to this, a predetermined bias voltage (voltage, which is normally lower than power voltage VCC by threshold voltage Vth) is applied to each of the paired bit lines BL /BL.

Thereby, the bit line load circuit 14 functions as a resistor load, which sets a voltage difference $\Delta VBL$ between the pair of bit lines BL, /BL by equivalent impedance of bit line load transistors QL1 an QL2. Due to this, basically, the same operation as the conventional SRAM can be performed at the time of the normal reading/writing operation.

In other words, the reading mode is set when an internal writing signal WE becomes inactive. In this mode, the bit line load circuit 14 applies a predetermined bias voltage to each of the paired bit lines BL, /BL. One sub-word line (for example, SWL1) is selected in accordance with the address input signal, and data of the memory cell selected from the sub-word line SWL1 is output to the paired bit lines BL, /BL. In this case, one of the pair of bit lines BL, /BL is pulled-down by read out data from the memory cell (for example, M1), and the potential difference is generated between the pair of the bit lines BL, /BL. The column selection circuit 11 is controlled to select a specific column by the column selection signal CD. Thereby, the voltage difference $\Delta VBL$ (potential difference reflecting data of the selected memory cell) appearing in the pair of the bit lines BL, /BL of the selected specific column is input to the sense amplifier 12 via the pair of the common bit lines SS, /SS and amplified, and read out data Dout is output.

Moreover, the writing mode is set when an internal writing signal WE becomes active. In this mode, the bit line load circuit 14 applies a predetermined bias voltage to each of the paired bit lines BL, /BL. Then, complementary writing data, which is transmitted to the pair of the common bit lines (SS, /SS) by the writing circuit 13, is written to the memory cell selected by the specific sub-word line (for example, SWL1) and the column selection circuit 11. In this case, one bit line is pulled-down to the ground voltage VSS, and the other bit line is pulled-down up to the power voltage VCC.

In the burn-in process in a wafer state, two stepped operation is performed when the voltage stress test is carried out. At the time of the voltage stress test, the column selection circuit 11 may be partially selected or non-selected if the column selection circuit 11 is not in a writing state. In this embodiment, all columns are in a non-selecting state.

In the first step, one transistor QL1 of the bit line load circuit 14 connected to each column is controlled to be in a high impedance state by the control signal BLL, thereby obtaining a state that no bias voltage is applied to the bit line BL connected to the transistor QL1.

Moreover, the other transistor QL2 is controlled to be in a low impedance state by the control signal BLR, which is used in the normal operation, thereby obtaining a state that bias voltage is applied to the bit line /BL connected to the transistor QL2. Then, all word lines and all block selection signals are controlled to be in a selecting state, thereby all sub-word lines are selected. In this state, voltage stress is applied to each SRAM cell. At this time, since the bias voltage is not applied to one bit line BL, the voltage of the bit line BL drops to the ground voltage VSS after passing a fixed time. In a case of, for example, memory cell M1, the internal node N1 becomes low voltage VSS, internal node N2 becomes high voltage VCC, driving transistor Q1 is in an ON state, driving transistor Q2 is in an OFF state, that is, a state that data "0" is written. This condition is similar to all memory cells connected to the same column as that of the above memory cell. Due to this, it can be said that data "0" is written to all memory cell. At this time, since the driving transistors Q2 of all memory cells are turned off, the voltage of the other bit line /BL is biased to VCC−Vth, and no current flows to the load transistor QL2 connected to the bit line /BL.

Moreover, the load transistor QL1, which is connected to the bit line BL dropping to the ground voltage VSS as mentioned above, is controlled to be in a high impedance state. Due to this, no current flows to the load transistor QL1.

Therefore, regarding current (current flowing to the memory cell array) flowing to the all memory cells and the bit line load circuit 14, for example, even in the SRAM of about 1M bit, the total current flowing to high resistor loads R1 and R2 is only about 1 $\mu$A. This value is substantially the same as the consumption current in a stand-by state at the time of the normal operation of the SRAM.

In this case, the following explains how stress is applied to transistors Q1 to Q4 and the internal nodes N1 and N2 which constituting the memory cell.

In the driving transistor Q1 and the transfer transistor Q3, each gate is power voltage VCC and source and drain are ground voltage Vss. Due to this, high voltage stress is applied to the gate oxide film. Moreover, high voltage stress is also applied to a diffusion region and constituting the internal node N1. In addition, since all memory cells are selected, high voltage stress is applied to each gate oxidation film of the driving transistor Q1 and the transfer transistor Q3 and the diffusion region constituting the internal node N1 at the same time in the all memory cells.

In the second step of the voltage stress test, the other transistor QL2 of the bit line load circuit 14 connected to each column is controlled to be in a high impedance state by the control signal BLR, so that no bias voltage is applied to the bit line /BL connected to the transistor QL2. At the same time, one transistor QL1 is controlled to be in a low impedance state by the control signal BLL which is similar to the signal used at the time of the normal operation, to apply bias voltage to the bit line BL connected to the transistor QL1. Moreover, all main word lines /MWL1, /MWL2 and all block selection signals SD1 and /SD2 are controlled to be in a selection state, thereby all sub-word lines are selected. Under this state, voltage stress is applied to each SRAM cell. At this time, the voltage of the bit line /BL drops to the ground voltage VSS after passing a fixed time, so that data "1" is written in all memory cells. In this state, the consumption current is substantially the same as the case of the stand-by state at the time of the normal operation. In all SRAM cells, high voltage stress is simultaneously applied to each gate oxidation film of the driving transistor Q2 and the transfer transistor Q4 and the diffusion layer constituting the internal node N2.

For example, high voltage stress is applied to the SRAM of about 1M bit in a DC (direct current) manner for 12 seconds in all (6 seconds for each step), thereby stress corresponding to 100 hours for the conventional burn-in test can be applied to each memory cell and time for the burn-in test can be reduced to about $1/10^{16}$ of the conventional burn-in test.

Figure 3:
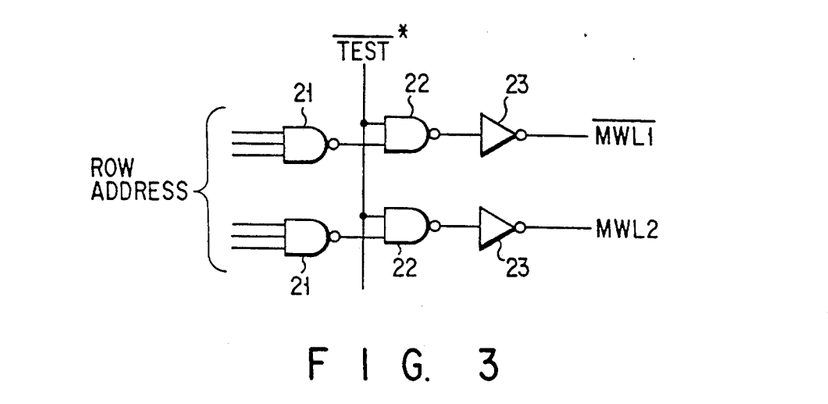
FIG. 3 is a circuit diagram showing a example of a word line driving circuit of FIG. 2.

FIG. 3 shows one example of the word line selector 10 of FIG. 2.

In this circuit, reference numeral 21 shows a row decoder, reference numeral 2 is a two-input NAND gate, and reference numeral 23 is a main word line driving inverter. A stress test signal /TEST is an internal test state selection signal, which is generated in a chip (for example, circuit 16 of FIG. 2) based on a stress test signal input from an external unit. The /TEST and an output signal of the row decoder 21 are input to the NAND gate 22. The output of the NAND gate 22 is inverted by the main word line driving inverter 23, and supplied to the main word lines /MWL1 and /MWL2.

According to the circuit of FIG. 3, at the time of the normal operation (signal /TEST is in an inactive level of "H"), the main word lines /MWL1 and /MWL2 can be selected in accordance with the output signal of the row decoder 21 corresponding to the address. In contrast, at the time of the voltage stress applying test (signal /TEST is in an active level of "L"), all main word lines WL1, /MWL2 can be selected since the output of the main word line driving inverter 23 is in an active state ("L" level) regardless of the output signal of the row decoder 21.

Moreover, the block selector 15 of FIG. 2 can be realized in accordance with the structure of FIG. 3. More specifically, the signal /TEST and a block selection signal from a column decoder (not shown) are input to the two input NAND gate and the output of the NAND gate is inverted by the block selection line driving inverter to obtain block selection signals /SD1, /SD2. Thereby, the block selection signal is in a selection state in accordance with the address at the time of the normal operation, and all block selection signals can be controlled to be selected at the time of the voltage stress test.

Figure 4:
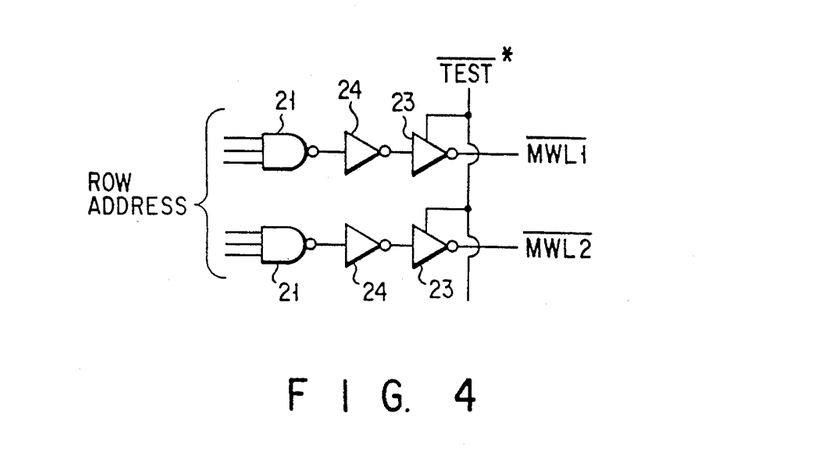
FIG. 4 is a circuit diagram showing a modification of the word line driving circuit of FIG. 3.

FIG. 4 is a circuit diagram showing a modification of the word line driving circuit of FIG. 3.

In this circuit, the output of the row decoder 21 is input to the main word line driving inverter 23 via the inverter 24. The supply of the power voltage VCC to the main word line driving inverter 23 is controlled by the signal /TEST.

Therefore, since the power voltage VCC is supplied to the main word line driving inverter 23 at the time of the normal operation (signal /TEST is in an inactive level of "H"), the main word line selection signal can be obtained in accordance with the output signal of the row decoder 21. However, the power voltage VCC is not supplied to the main word line driving inverter 23 at the time of the voltage stress test (signal /TEST is in an active level of "L"). Due to this, the main word line selection signal is in an active state ("L" level) regardless of the output signal of the row decoder 21.

Since the circuit of FIG. 4 uses the inverter 24, there is an advantage in that the high speed operation can be performed at the time of the normal operation as compared with the circuit of FIG. 3 using two-input NAND gate 22.

According to the structure of the circuit of FIG. 4, the supply of the power voltage VCC to the block selection circuit 15 and the sub-word line selection gates (sub-word line driving circuit) G1 to G4 is controlled by the signal /TEST. Thereby, all block selection signals /SD1, /SD2 and all sub-word lines SWL1 to SWL4 can be in an active state ("L" level). In a case where the semiconductor substrate of the SRAM of the present embodiment is p type and the PMOS transistor of the sub-word line selection gates G1 to G4 and the PMOS transistor of the block selector 15 are differently separated in different N-type well regions, there is no problem even if the power voltage VCC is supplied to the block selection line driving circuit at the time of the voltage stress test.

In the above explanation, the supply of the power voltage VCC to all of the main word line driving inverter 23, the block selection circuit 15 and the sub-word line selection gates G1 to G4 is controlled. In place of such supply of the power voltage VCC, even if the supply of the power voltage VCC to at least the sub-word line driving gates G1 to G4 is performed, all block selection signals can be controlled to be selected at the time of the voltage stress test.

Figure 5:
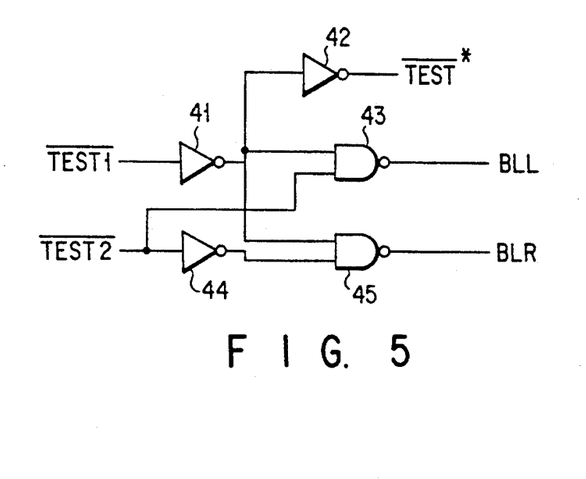
FIG. 5 is a circuit diagram showing an example of a circuit for generating a bit line load control signal of FIG. 2 and a selection signal in an internal test state of FIGS. 3 and 4.

FIG. 5 shows an example of the circuit for generating bit line load control signals (BLL, BLR) of FIG. 2 and signal /TEST of FIGS. 3 and 4.

In FIG. 5, a signal /TEST 1 is a first test signal input for controlling a transition from the normal operation mode to the voltage stress test mode, and a signal /TEST 2 is a second test signal input for determining which bit line load transistor (QL1 or QL2) should be controlled to be in a high impedance state.

The signal /TEST1 passes through first and second inverters 41 and 42, and becomes a signal /TEST. The output of the first inverter 41 and the signal /TEST 2 are input to a first two-input NAND gate 43, and the output of the NAND gate 43 becomes one bit line load control signal BLL.

The signal input /TEST 2 is input to a third inverter 44, and the output of the third inverter 44 and the output of the first inverter 41 are input to a second two-input NAND gate 45, and the output of the NAND gate 45 becomes the other bit line load control signal BLR.

Thereby, at the time of the normal operation (signal input /TEST 1 is in an inactive level of "H"), the signal /TEST is in an inactive level of "H", and bit line load control signals (BLL, BLR) are in a "H" level regardless of the signal input /TEST 2.

In contrast, at the time of the voltage stress test (signal input /TEST 1 is in an active level of "L"), the signal /TEST is in an active level of "L", and either bit line load control signal BLL or BLR is in a "L" level, depending on whether the signal input /TEST 2 is "H" or "L."

Therefore, in order to control the above-mentioned two-stepped voltage stress test using the circuit of FIG. 5, the control may be performed by the following sequence.

First, in the first step, the signal input /TEST 1 is in an "L" level, and the signal input /TEST 2 is in a "H" level. Thereby, one bit line load transistor QL1 is in a high impedance state. In the second level, the signal input /TEST 2 is in an "L" level, so that the bit line load transistor QL2 is in a high impedance state. Thereafter, the signal input /TEST 1 is returned to the "H" level to return the normal reading operation mode.

The following methods can be considered as a method of the supply of the control signal for the stress test.

(a) The control signal is input from the external unit through a dedicated pad on the SRAM chip in a water state.

(b) The wafer is divided, and the SRAM chip is separated and sealed to a package. Thereafter, the control signal is input from the external unit through a dedicated terminal, which is not used at the time of the normal operation.

(c) Voltage, which is in the range that such voltage is not used at the time of the normal operation (e.g., voltage, which is more than the power voltage) is input from the external unit to an arbitrary terminal (terminal, which is used at the time of the normal operation, may be used).

(d) The signal is input to a plurality of terminals, which are used at the time of the normal operation, in order, which is not used at the time of the normal operation. Then, a circuit for detecting the input is provided, and the output of this circuit is used.

The method of the supply of the signal input /TEST 1 and the signal input /TEST 2 from the external unit will be explained in detail as follows:

(a) In the burn-in process of the SRAM in a wafer state, a dedicated pad for the signal input /TEST 1 and a dedicated pad for the signal input /TEST 2 (or an address data input pad, which is used at the time of the normal operation, may be used in common) are formed on the SRAM chip. Then, the signal /TEST 1 is input from a probe card of a tester to the above pads.

In this case, the number of pins, which are necessary to the probe card, may be small, that is, five. These pins correspond to the power voltage VCC, the ground voltage VSS, the signal input /TEST 1, the signal input /TEST 2, and a chip selection signal input CE, respectively. Moreover, the time of the stress test may be several seconds in both the first stage and the second stage. The stress application may be performed with smooth timing in a DC manner. Thereby, a test pattern generator can be simplified and the manufacturing cost can be reduced. Moreover, since the testing time per one chip is short, that is, about 10 seconds, throughput is sufficiently large even if the testing is performed one chip by one or several chips are tested at the same time in a wafer state.

(b) In the burn-in process after the SRAM chip is sealed in the package, as signal input /TEST 1, there is used an output of a circuit (high voltage detection circuit) for detecting that high voltage more than VCC is applied to an address data input pin, which is used at the time of the normal operation or an arbitrary control input pin. Thereby, it is unnecessary to provide a special pin for the stress test.

Figure 6:
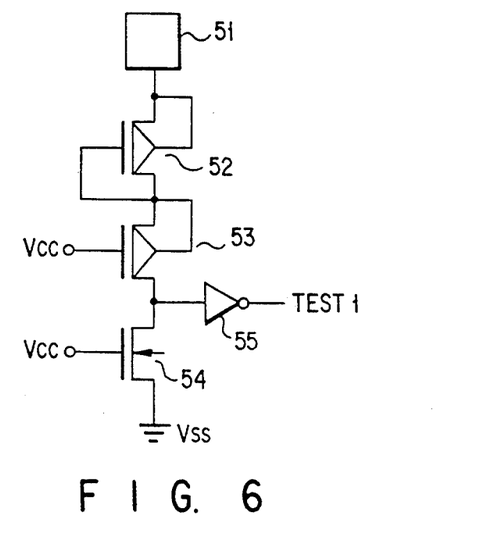
FIG. 6 is a circuit diagram showing an example of a circuit for generating a stress test signal of FIGS. 4 and 5.

FIG. 6 shows a ternary control circuit as an example of the high voltage detection circuit.

Reference numeral 51 is a control input pin (for example, address input pin). Two P channel MOS transistors 52 and 53 and on N channel MOS transistor 54 are series-connected between the address input pin 51 and the ground voltage VSS. Gate and drain are mutually connected to the transistor 52, and power voltage VCC is supplied to the gate of each of the transistors 53 and 54. Moreover, an inverter 55 is connected to a series connecting point between the transistors 53 and 54.

According to the circuit of FIG. 6, in a case where voltage of normal "H" level (VCC) o "L" level (VSS) is applied to the address input pin 51, the transistor 52 is in an OFF state, and the voltage of the input node of the inverter 55 is set to be in an "L" level by the transistor 54, which is in an ON state. Thereby, the signal /TEST 1 to be output from the inverter 55 is in a "H" level (inactive state).

In contrast, in a case where control voltage (more than VCC+2|Vthp|, Vthp is threshold voltage of a P channel MOS transistor), which is higher than power voltage VCC, is applied to the address input pin 51, the transistor 52 is turned on, and voltage of the input node of the inverter 55 becomes VCC or more. Thereby, the test signal /TEST 1 to be output from the inverter 55 is in a "L" level (active state).

Figure 7:
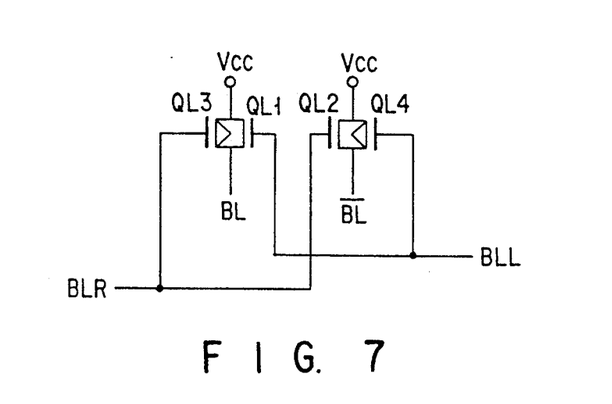
FIG. 7 is a circuit diagram showing a modification of the bit line load circuit of FIG. 2.

FIG. 7 shows a modification of the bit line load circuit 14 of FIG. 2.

In this circuit, PMOS transistors QL3 and QL4 are parallel-connected to the bit line load NMOS transistors QL1 and QL2. In PMOS transistors QL3 and QL4, the corresponding bit line load control signals BLR and BLL are applied to the gate.

Thereby, the PMOS transistors, which are parallel-connected to the NMOS transistors to be controlled to be in a low impedance state, can be also controlled to be in a low impedance state at the time of stress time.

According to the circuit of FIG. 7, the PMOS transistors QL1 and QL2 bias the bit line voltage to the level of VCC - Vth at the normal reading operation, and the PMOS transistors QL3 or QL4 change the one bit line voltage to the voltage VCC, which is higher than the voltage at the normal reading operation, at the stress test. Thereby, stress to be applied to the SRAM is strengthened and the burn-in process time can be further shortened.

SRAM of the second embodiment will be explained with reference to FIG. 2.

SRAM of the second embodiment is different from that of the first embodiment in the following points (a) to (c).

(a) Both bit line load transistors QL1 and QL2 are controlled to be in a high impedance state (or off state) at the time of stress test.

(b) At the time of stress test, all column selection signals CD are set to be in a selection state as well as the main word line selection signals /MWL1, /MWL2, . . . and the block selection signals /SD1, /SD2, . . .

(c) The writing circuit 13 is controlled to be in a writing state at the time of stress test.

Since the operation of the SRAM of the second embodiment is basically the same as that of the first embodiment, the specific explanation is omitted. The following explains the characteristic operation of SRAM of the second embodiment.

At the time of stress test, both bit line load transistors QL1 and QL2 are controlled to be in a high impedance state, the writing circuit is set to be in a writing state, and the column selection circuit 11 are set to be in a selection state. Due to this, writing data is set to "1" or "0", thereby data "1" or "0" is simultaneously written into all memory cells, and stress is simultaneously applied to all memory cells. At this time, since the bit line load circuit 14 is controlled to be in a high impedance state, no current flows to the bit line load circuit 14.

The SRAM of the second embodiment can obtain basically the same technical advantage as that of the first embodiment. Moreover, it is unnecessary to control the bit line load transistors QL1 and QL2 to be in a high impedance state one by one at the time of stress test. Both bit line load transistors QL1 and QL2 can be controlled to be in a high impedance state at the time of stress test. Due to this, the structure of the control circuit can be simplified. Moreover, input of the normal writing data can be used as data writing control to all memory cells.

The SRAM of the third embodiment will be explained as follows.

The SRAM of the third embodiment is different from that of the first embodiment in the following points (a) and (b).

(a) Similar to the normal operation time, the bit line load transistors QL1 and QL2 are controlled to be in a low impedance state at the time of the stress time, respectively.

Figure 8:
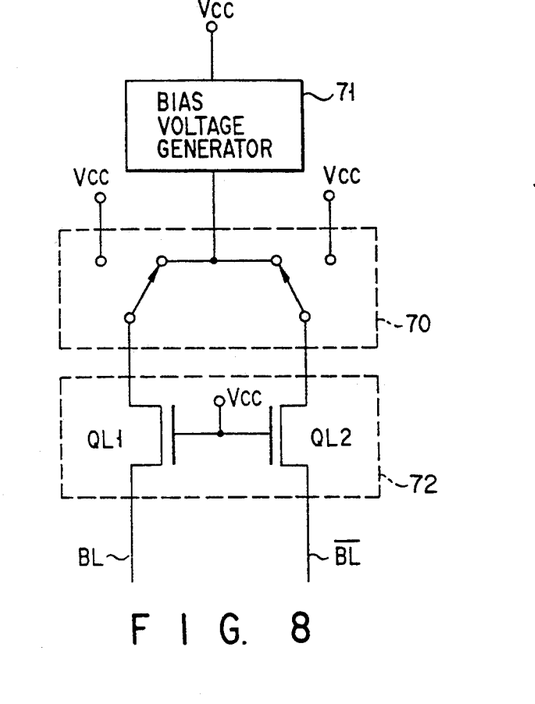
FIG. 8 is a circuit diagram showing a part of a SRAM of a second embodiment of the present invention.

(b) As shown in FIG. 8, there is provided a control circuit 70 in which each one end of the bit line load transistors QLl and QL2 is changed to the output node (or VSS node) of a bias generating circuit 71 at the time of the stress time. The bias generating circuit 71 is an internal power drop voltage circuit, which generates lower voltage than the power voltage VCC.

According to the SRAM of the third embodiment, the pair of the bit lines BL, /BL are connected to the output node (or VSS node) of the bias generating circuit 71 via the bit line load transistors QL1 and QL2 at the time of the voltage stress test. Due to this, the voltage level becomes lower than the bias level of the normal operation. Therefore, voltage stress is applied to all word lines or a number of word lines greater than the number of word lines selected at the time of the normal operation, so that stress is applied between the gate and drain of the transfer gate of the all memory cells at the same time. At this time, since the pair of the bit lines BL, /BL are in a low level no current flows into the bit line load circuit 72.

The SRAM of the fourth embodiment will be explained as follows.

The SRAM of the fourth embodiment is different from that of the first embodiment in the following points (a) and (b).

(a) The bit line load transistors QL1 and QL2 are controlled to be in a high impedance state (off state) at the time of the stress time, respectively.

Figure 9:
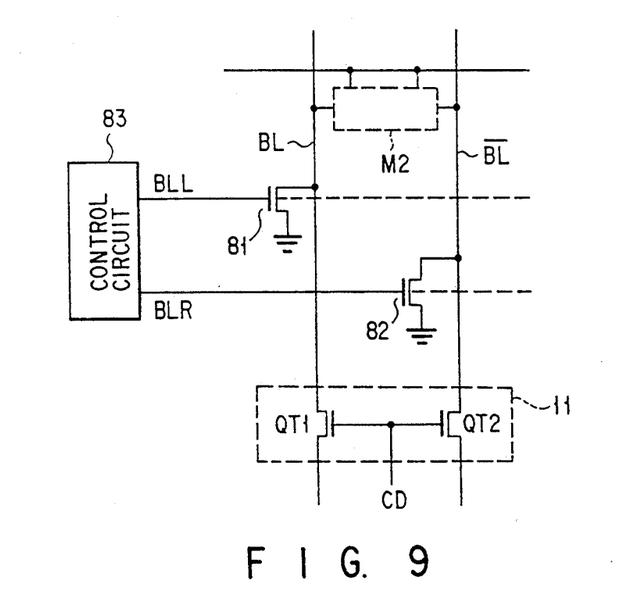
FIG. 9 is a circuit diagram showing a part of a SRAM of a third embodiment of the present invention.

(b) As shown in FIG. 9, switching NMOS transistors 81 and 82 are connected between the pair of the bit lines BL, /BL and the ground voltage VSS. Then, there is provided a control circuit 83 for applying different control signals (or the same control signals) BLL, BLR to each gate of a switching transistor 81 group connected to one bit line BL side and each gate of a switching transistor 82 group connected to the other bit line /BL side.

The control circuit 83 controls all switching transistors groups 81 and 82 to be in an off state at the time of the normal operation, and controls an arbitrarily one of the switching transistor groups 81 and 82 or both transistor groups to be in an on state. The control circuit 83 may be structured by a logic circuit, which is based on the control circuit of FIG. 5.

According to the SRAM of the fourth embodiment, at the time of the voltage stress test, the bit line load circuit 14 is controlled to be in a high impedance state and the column selection circuit 11 is controlled to be in a non-selection state. Then, an arbitrarily selected one (e.g., 81) of the switching transistor groups is controlled to be turned on, so that an arbitrarily selected one (e.g., BL) of the bit line groups can be set to the ground voltage VSS. Moreover, all switching transistor groups (81, 82) are controlled to be turned on, so that the voltages of all bit line groups can be set to the ground voltage VSS. Therefore, voltage stress is applied to all word lines or more than the number of word lines to be selected at the time of the normal operation, so that stress is applied between the gate and drain of the transfer gate of the all memory cells at the same time. At this time, since the pair of the bit lines BL, /BL are in a state of ground voltage VSS, no current flows into the bit line load circuit.

In the above-mentioned embodiments, in a case where a dedicated pad is formed in order to apply the stress test signal, a bonding pad may be formed. In the burn-in process of the SRAM in a wafer state, such a pad may be structured to be in contact with a probe of a probe card of a tester, thereby the stress test signal can be applied. Moreover, in the burn-in process in which the SRAM chip is separated from the wafer and packaged, such a pad may be structured to be connected to the wire of the outside portion of the chip in packaging.

Furthermore, in the burn-in process of the SRAM in a wafer state, the above stress testing pad is used for a plurality of chip regions in common, and a wire for connecting the portion between such a common pad and the plurality of chip regions may be formed on, for example, a dicing line region of the wafer.

In the above-mentioned embodiments, four transistor-typed cell is used as memory cells M1, M2. Even if a SRAM cell of CMOS flip-flop type using PMOS transistors is used in place of two load high resistors R1 and R2, the technical advantage of the present invention can be obtained.

The above-mentioned embodiments explain the case of the voltage stress test in the burn-in process. However, it is needless to say that the present invention is useful in the case of the voltage stress test regardless of the temperature acceleration.

The present invention is not limited to the embodiments specifically shown in the specification and the drawings. Various modifications may be made without departing from the spirit and the scope of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A static random access memory comprising:
a memory cell array having a plurality of static memory cells arranged in a matrix manner, a plurality of word lines for selecting said memory cells, and a plurality of pairs of bit lines receiving and transmitting data between said memory cells;
a word line driving circuit selecting a first predetermined number of word lines in accordance with an input address at the time of a normal operation, and simultaneously selecting all word lines or a second predetermined number of word lines, the second predetermined number of word lines being greater than the first predetermined number of word lines selected at the time of the normal operation, at the time of a voltage stress applying test operation;
a column selection circuit connected to the pair of bit lines of each column, and selectively controlled by a column selection signal;
a sense amplifying circuit connected to said column selection circuit;
a writing circuit connected to said column selection circuit; and
a bit line load circuit having two bit line load transistors each connected to the pair of bit lines of each column, for applying a predetermined bias voltage to said pair of bit lines at the time of the normal operation, and controlling the bias voltage not to be applied to at least one of said pair of bit lines at the time of the voltage stress test operation.

2. The static random access memory according to claim 1, wherein one of said two bit load transistors of said bit line load circuit is controlled to be in a high impedance state or in an off state.

3. The static random access memory according to claim 2, wherein said bit line load circuit has a first gate circuit for ANDing a first test signal for controlling a transition from the normal operation mode to the voltage stress test mode and a second test signal for determining which bit line load transistor should be controlled to be in a high impedance state, and a second gate for ANDing an inversion signal of said second test signal and said first test signal.

4. The static random access memory according to claim 1 or 2, wherein said two bit line load transistors of said bit line load circuit are respectively controlled to be in a high impedance state or in an off state at the time of the voltage stress test operation.

5. The static random access memory according to claim 4, further comprising a plurality of switching transistors connected between each bit line and a ground voltage wherein one of said switching transistors is connected to one bit line of a bit line pair and another of said switching transistors is connected to the other bit line of the bit line pair, wherein one of said switching transistors is controlled to be in an on state at the time of the voltage stress test operation.

6. The static random access memory according to claim 4, further comprising a plurality of switching transistors connected between each bit line and a ground voltage wherein both switching transistors, one is connected to one bit line side and the other is connected to the other bit line side, are controlled to be in an on state at the time of the voltage stress test, respectively.

7. The static random access memory according to claim 4, wherein said column selection circuit selects a third predetermined pair of the bit lines in accordance with an input address at the time of a normal writing operation, and simultaneously selects all bit lines or a fourth predetermined number of bit lines, the fourth predetermined number of bit lines being greater than the third predetermined number of bit lines selected at the time of the writing normal operation, at the time of the voltage stress test operation.

8. The static random access memory according to claim 1, wherein said memory cell array is divided into a plurality of blocks in a row direction, and has a main word line, which is formed in common to the plurality of blocks, and a sub-word line formed every block; and said word line driving circuit has a main world line driving circuit for driving said main word line, a block selection circuit for selecting the blocks of said memory cell array, and a sub-word line driving circuit for driving said sub-word line after obtaining AND of the output signals of said two circuits, wherein all sub-word lines or a second number of the sub-word lines, which is greater than a first number of sub-word lines selected at the time of the normal operation, are selected at the same time at the time of the voltage stress test operation.

9. The static random access memory according to claim 8, wherein said word lien driving circuit restricts at least the supply of the operation power of said sub-word line driving circuit at the time of the voltage stress test.

10. The static random access memory according to claim 1, wherein a control signal for a stress test is input from a dedicated pad or an external terminal.

11. The static random access memory according to claim 1, wherein a circuit for detecting the input of voltage, which is more than a power voltage, from the outside is provided, and the output of said circuit is used as a control signal for the stress test.

12. A static random access memory comprising:
a memory cell array having a plurality of static memory cells arranged in a matrix manner, a plurality of word lines for selecting said memory cells, and a plurality of pairs of bit lines receiving and transmitting data between said memory cells;
a word line driving circuit selecting a first predetermined number of word lines in accordance with an input address at the time of a normal operation, and simultaneously selecting all word lines or a second predetermined number of word lines, the second predetermined number of word lines being greater than the first predetermined number of word lines selected at the time of the normal operation, at the time of a voltage stress applying test operation;
a column selection circuit connected to the pair of bit lines of each column, and selectively controlled by a column selection signal;
a sense amplifying circuit connected to said column selection circuit;
a writing circuit connected to said column selection circuit; and
a bit line load circuit having two bit line load transistors each connected to the pair of bit lines of each column, for applying a first predetermined bias voltage to said pair of bit lines at the time of the normal operation, and for applying a second predetermined voltage, wherein the second predetermined voltage being less than the first predetermined voltage at the time of the normal operation, or for applying a ground voltage to said bit lines at the time of the voltage stress test operation.

13. The static random access memory according to claim 12, further comprising a bias circuit for generating said second voltage; and
a changing circuit for changing the connection of said pair of bit lines to an output node of said bias circuit or a ground node at the time of the voltage stress time, wherein said two bit load transistors are respectively controlled to be in a low impedance state at the time of the voltage stress time.

14. The static random access memory according to claim 12 or 13, wherein said column selection circuit selects a first predetermined number of pairs of the bit lines in accordance with an input address connected to said writing circuit at the time of a normal writing operation, and simultaneously selects all bit lines or a second predetermined number of pairs of bit lines, wherein the second predetermined number of pairs of bit lines is greater than the first predetermined number of pairs of bit lines selected at the time of the normal operation, at the time of a voltage stress test operation.

* * * * *